US008190415B2

(12) United States Patent
Lerner et al.

(10) Patent No.: US 8,190,415 B2
(45) Date of Patent: May 29, 2012

(54) METHOD FOR THE CONSTRUCTION OF VERTICAL POWER TRANSISTORS WITH DIFFERING POWERS BY COMBINATION OF PRE-DEFINED PART PIECES

(75) Inventors: Ralf Lerner, Erfurt (DE); Wolfgang Miesch, Frankfurt (DE)

(73) Assignees: X-FAB Semiconductor Foundries AG, Erfurt (DE); alpha microelectronics GmbH, Frankfurt (DE)

( * ) Notice: Subject to any disclaimer, the term of this patent is extended or adjusted under 35 U.S.C. 154(b) by 674 days.

(21) Appl. No.: 11/576,736

(22) PCT Filed: Oct. 5, 2005

(86) PCT No.: PCT/DE2005/001780
§ 371 (c)(1),
(2), (4) Date: Jan. 16, 2008

(87) PCT Pub. No.: WO2006/037313
PCT Pub. Date: Apr. 13, 2006

(65) Prior Publication Data
US 2008/0243443 A1 Oct. 2, 2008

(30) Foreign Application Priority Data
Oct. 5, 2004 (DE) .......................... 10 2004 048 278

(51) Int. Cl.
G06F 17/50 (2006.01)
G06G 7/62 (2006.01)
H01L 29/66 (2006.01)

(52) U.S. Cl. ................ 703/13; 703/1; 257/341

(58) Field of Classification Search ............... 703/1, 13; 257/341
See application file for complete search history.

(56) References Cited

U.S. PATENT DOCUMENTS

| 5,140,388 A | * | 8/1992 | Bartelink ................ 257/369 |
| 5,686,750 A | | 11/1997 | Takahashi |
| 5,763,914 A | | 6/1998 | Hshieh et al. |
| 5,844,277 A | | 12/1998 | Hshieh et al. |
| 5,917,729 A | * | 6/1999 | Naganuma et al. ........ 716/122 |
| 6,462,976 B1 | * | 10/2002 | Olejniczak et al. ........ 363/147 |
| 6,591,408 B1 | | 7/2003 | Asahina |
| 6,651,236 B2 | | 11/2003 | Ichimiya et al. |
| 6,769,007 B2 | | 7/2004 | Sutherland et al. |
| 7,080,341 B2 | * | 7/2006 | Eisenstadt et al. ......... 716/13 |

OTHER PUBLICATIONS

Gilles Fourneris, et al.; Demosthenes-A Technology-Independent Power DMOS Layout Generator; Proceedings of the EURO-DAC 93 and EURO-VHDL 93; European Design Automation Conference; Sep. 1993; pp. 178-183; IEEE Comput. Soc. Press.

* cited by examiner

*Primary Examiner* — Kandasamy Thangavelu
*Assistant Examiner* — Nithya Janakiraman
(74) *Attorney, Agent, or Firm* — Stevens & Showalter LLP

(57) ABSTRACT

A method for designing a first vertical MOS power transistor having a specified design power level. The method comprises the steps of composing a layout of the vertical MOS power transistor as a combination of at least partly differing layout part pieces, each of the part pieces having known design data, the part pieces including at least one first layout part piece comprising a given number of single transistor cells, and adjusting the specified design power level of the first vertical MOS power transistor by using the known design data of the part pieces and based on the layout combination of the part pieces.

16 Claims, 4 Drawing Sheets

METHOD FOR THE CONSTRUCTION OF VERTICAL POWER TRANSISTORS WITH DIFFERING POWERS BY COMBINATION OF PRE-DEFINED PART PIECES

BACKGROUND OF THE INVENTION

1. Field of the Invention

The invention relates to a method for the construction of vertical power transistors (DMOS or IGBT) having a variable channel width, which may be drawn or designed by the designer so as to have the desired channel width and thus the appropriate on-resistance and which may be described on the basis of electric parameter depending on the channel width. In the present case discrete and integrated vertical power transistors are contemplated.

2. Description of Related Art

A vertical transistor used in the field of power electronics typically consists of a plurality of single transistor cells arranged in a parallel manner and a terminal contact for the gate electrode, as is for instance described in U.S. Pat. No. 5,844,277, cf. FIGS. 2A to D and FIGS. 5-7, and U.S. Pat. No. 5,763,914. These single transistor cells have a common gate electrode, a common drain terminal at the back side of the silicon wafer and separate source or well terminals within the silicon that, however, are connected in parallel by a common metal electrode. The number and the size of the single transistor cells determine the transistor area, the channel width and the on-resistance, as is described by Baliga in Power Semiconductor Devices, 1995, pages 367 onwards. In order to obtain the desired on-resistance of a vertical DMOS transistor in conventional techniques the entire transistor including a corresponding active area and an edge structure connectable to the periphery has to designed. Starting from a transistor having a first on-resistance to obtain a second transistor having a differing on-resistance it is necessary to newly design the entire transistor. Typically, the required electric parameters of the vertical DMOS transistor are measured and described separately for each different transistor.

For designing integrated circuits methods are known in which the circuit is composed by individual blocks. As e.g. shown in U.S. Pat. No. 6,769,007, in which is described the composing of an integrated circuit on the basis of individual blocks. Also, the composing of an integrated circuit or parts thereof on the basis of individual blocks separately to be connected by metal conductors is described in U.S. Pat. No. 6,651,236 and U.S. Pat. No. 6,591,408.

BRIEF SUMMARY OF THE INVENTION

It is an object of the invention to provide a method that enables to design vertical power transistors having differing on-resistances in a simplified manner.

According to one aspect of the present invention this object is solved by a method for designing a vertical power transistor having a specified design power, wherein the method comprises: composing a layout of the vertical MOS power transistor as a combination of at least partly differing layout part pieces, each having known design data, including at least a first layout part piece that has a pre-determined number of single transistor cells (2), and adjusting the specified design power using the known design data and the number of layout part pieces used.

Thus, according to the present invention the required time to be spent by the designer for the design of vertical power transistors having a defined active area may be reduced and also the effort for measurements and the description may be reduced. The designer is provided with a "pre-design", which may be appropriately adapted to the requirements of the designer in a fast and efficient manner. Furthermore, an efficient parametric description of the device may be achieved.

Due to the method according to the present invention transistors of different power, that is, different area or different on-resistance, may be designed in an efficient manner, i.e., fast and cost effective. The known design data allows an efficient description of the designed transistor on the basis of the initial pieces and appropriate calculation techniques for obtaining individual transistor parameters from known parameters of the single pieces.

In a further embodiment the specified design or target power is adjusted by the number of the first part pieces. In this way the desired power may be calculated and adjusted in an efficient manner.

In a further embodiment the single transistor cells of the first part pieces have the same configuration, thereby allowing the design of standard transistor configurations in an efficient manner.

In a further embodiment at least some of the part pieces comprise edge portions that may be composed in a sectional manner so as to form a complete edge portion in the layout of the vertical MOS power transistor. In this way the design may be accomplished without any new transistor components, such as adapted edge components.

In a further embodiment part pieces having identical edge portions comprise a defined number of always identical single transistor cells in the same geometrical arrangement, whereby the efficiency is further improved.

In a further embodiment each part piece comprises a defined section of the complete edge portion. In this way a complete transistor structure may be defined with a low number of design steps, since the edge portions are already included in the individual part pieces.

In a further embodiment a second part piece is used that comprises at least a gate terminal.

In a further embodiment the second part piece comprises a certain number of identical single transistor cells.

In a further embodiment the second part piece comprises a section of the complete edge portion.

In a further embodiment a third part piece is provided that differs from the first and second part pieces in at least one design characteristic. In this manner a plurality of transistor structures having differing power may be designed on the basis of only three different part pieces.

In a further embodiment the first, second and third part pieces comprise sections of the edge portion, which form the complete edge portion.

In a further embodiment the method comprises: designing at least a second vertical power transistor having a second differing specified design power by combining at least the first, second and third part pieces into device units of differently sized total area, wherein the scaling of the power between the vertical MOS power transistor and the second vertical MOS power transistor is determined by the size of a part piece forming the central portion of device area. That is, if necessary, different transistor types may efficiently be designed on the basis of a given power scaling, wherein no steps for the designing of new layout objects are required.

In a further embodiment each part piece is a standardized part piece, so that the part pieces may be combined in any manner.

In a further embodiment each part piece comprises a layout adjusted to corresponding dividing grid. In this way an efficient compilation may be achieved on a given platform, wherein the entirety of the characteristics is well-observable and efficiently computable due to the fixed layouts of the part pieces.

In a further embodiment at least one type of part pieces is provided, which does not comprise single transistor cells. Hence, the flexibility of the method more further be enhanced.

In a further embodiment the at least one type of part pieces without single transistor cells comprises part pieces including edge portions.

In a further embodiment at least one part piece is provided that does not include an edge portion.

In a further embodiment at least one part piece is provided that comprises a bond pad layout.

In a further embodiment at least one part piece is provided that comprises a drain terminal layout and/or a source terminal layout.

In a further embodiment the method further comprises: creating at least some differing layout part pieces by dividing the complete layout of a vertical power transistor having known design data. In this manner the required program objects may be created in a highly flexible manner and may be used for the further design operation of transistors, wherein in this case the constructional specialties of the base layout are taken into consideration in the new design process.

In a further embodiment the dividing comprises: creating a plurality of differing types of part pieces, wherein part pieces of the same type have the same configuration and the same design data; and calculating the design data of each type from the known design data of the complete layout in order to obtain standardized part pieces for a layout that is fixed to a dividing grid.

According to a further aspect the object is solved by a method for creating standardized layout part pieces for designing vertical MOS power transistors configured for differing power levels. The method comprises the steps of: creating at least some differing layout part pieces by dividing a complete layout into a plurality of single transistor cells of a vertical MOS power transistor having known design data; creating a plurality of differing types of part pieces, wherein part pieces of a respective type have the same configuration and the same design data; and calculating the design data of each type from the known design data of the complete layout to obtain standardized part pieces for a layout fixed to a dividing grid.

In this manner respective design tools may efficiently and highly flexibly be created.

In still a further aspect the object is solved by a system for designing vertical MOS power transistors that are configured for differing power levels. The system comprises a computer aided platform for the creation of layouts from layout part pieces according to a selected dividing grid, wherein the layout determines the construction of the vertical MOS power transistor; two or more differing part pieces, each of which has a different function and a different design data, wherein at least one first layout part piece including a certain number of identical single transistor cells is provided, wherein the tow or more part pieces in combination with the at least one first part piece may be combined to a complete vertical MOS power transistor, wherein the power levels of the layouts of the vertical MOS power transistors are defined by the number of first layout part pieces.

Further advantageous embodiments are provided in the claims and the following detailed description.

The invention will be described based on embodiments by referring to the schematic drawings, in which

DETAILED DESCRIPTION OF THE INVENTION

Figure 1:
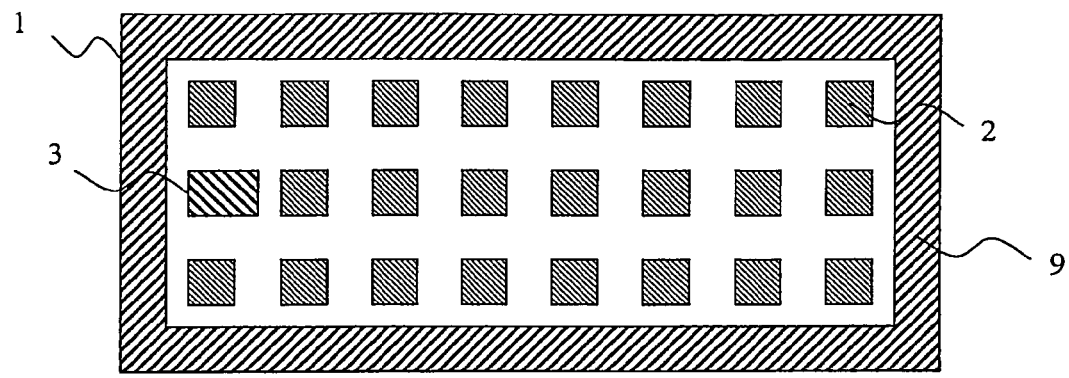
FIG. 1 is a plan view of a vertical power transistor having a first area.
Figure 3:
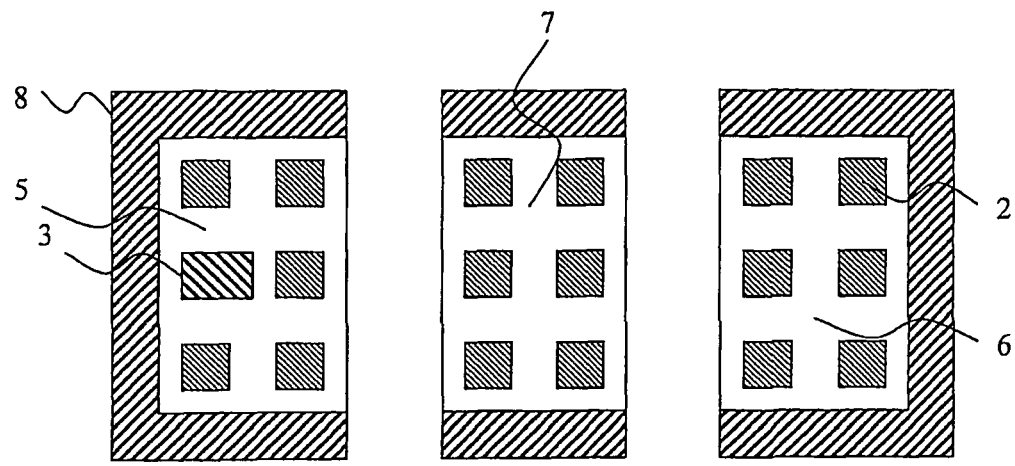
FIG. 3 illustrates single pieces of a divided vertical power transistor.

In FIG. 1 a transistor 1, that is, a layout corresponding to a specific vertical power transistor is shown. This layout is divided into differing part pieces as shown in FIG. 3, including: a first end piece 5, which may also include a gate terminal 3, for example, a second end piece 6 and a central or middle piece 7. Each of these part pieces includes a certain number of single transistor cells 2 and a corresponding part piece of an edge structure 9, as is shown in FIG. 1.

Figure 4:
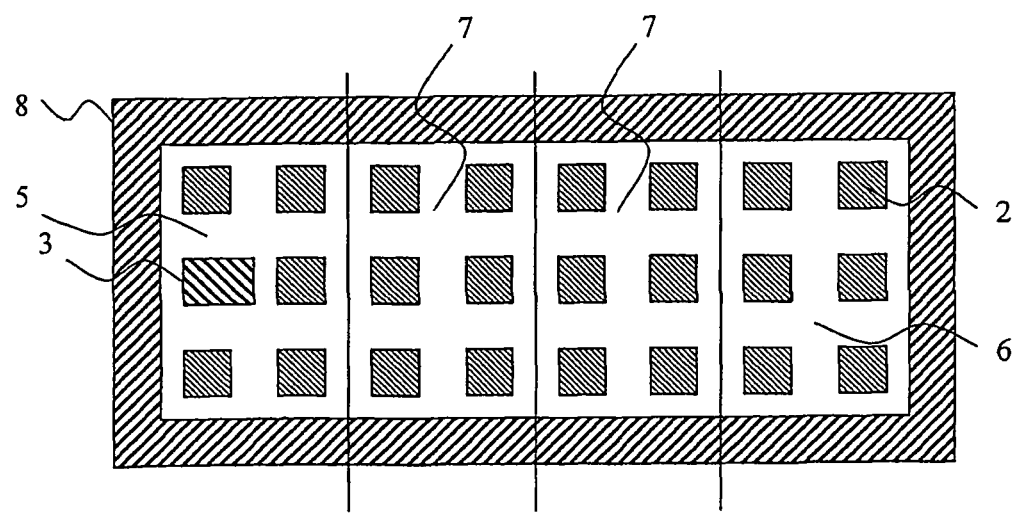
FIG. 4 illustrates a vertical power transistor composed of single pieces with an area as shown in FIG. 1.
Figure 5:
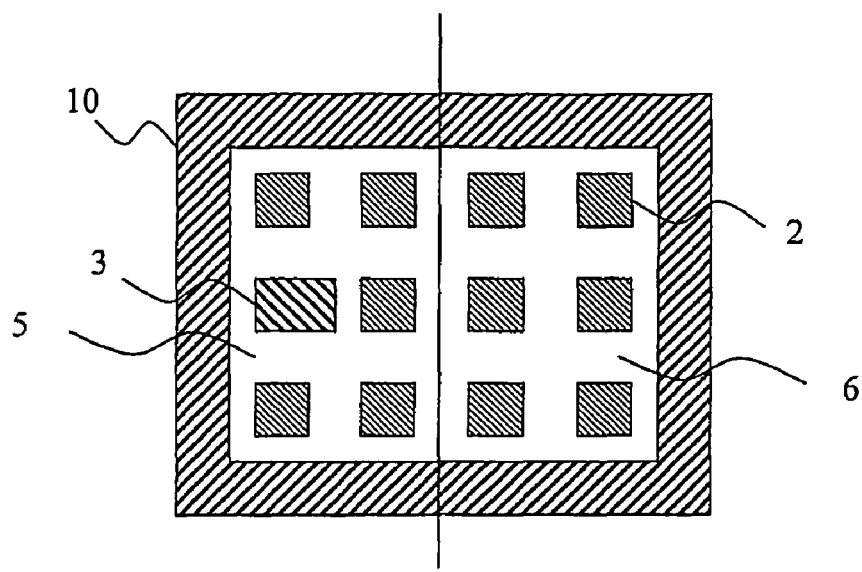
FIG. 5 illustrates a vertical power transistor composed of single pieces with a second area as shown in FIG. 2.

In FIG. 4 a transistor 8 is shown, that is, the transistor's layout, which has the same area as the transistor 1, wherein the transistor 8 of this example is composed of the first end piece 5, the second end pieces 6 and two central pieces 7. The parameters of the composed transistor may now be calculated on the basis of the parameters of the individual pieces.

The area of the transistor 8 is the sum of the area of the two end pieces 5 and 6 and two times the area of the central piece 7. By inserting further central pieces 7 the area of the transistor may nearly arbitrarily be increased. The area of the composed transistor having central pieces of number x may be described by:

$$A_{transistor}=A_{end\ piece5}+A_{end\ piece6}+x*A_{central\ piece7}$$

In the same way the capacitance of the composed transistor 8 may be determined. The capacitance of the composed transistor may be described, when using the well-known formula of the parallel connection of capacitors, by:

$$C_{transistor}=C_{end\ piece5}+C_{end\ piece6}+x*C_{central\ piece7}$$

As derivable from the well-known formula of the parallel connection of resistors the resistance of the transistor composed of an end piece 5, an end piece 6 and central pieces of number x may written as:

$$1/R_{transistor}=1/R_{end\ piece5}+1/R_{end\ piece6}+x*1/R_{central\ piece7}$$

In this example, the size of the central piece 7 determines the step width of the available area grading, that is, when using large central pieces 7 a coarse grading of the areas may be obtained. When using small central pieces 7, however, a finer grading of the areas may be generated. The size of the single transistor cell determines the minimum possible size of the central piece 7.

Figure 2:
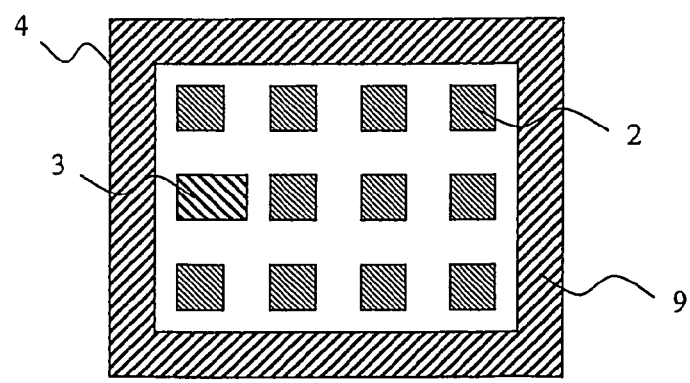
FIG. 2 depicts a vertical power transistor having a smaller area compared to the area of FIG. 1.

If a transistor is to be designed that corresponds, for example, to the transistor 4, that is, the layout of FIG. 2, this may be accomplished by composing the two end pieces 5 and 6. This also represents the smallest possible area, when a given type of central pieces 7 is provided. Other central pieces may also be used so as to enhance the design flexibility.

Figure 6:
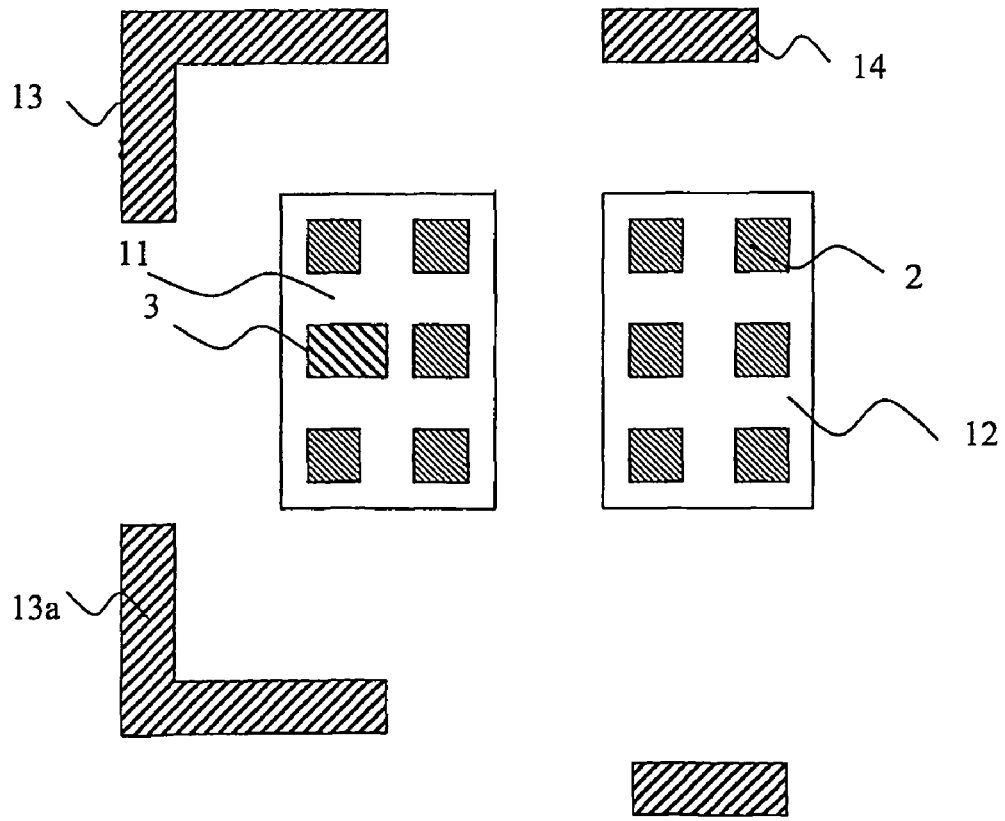
FIG. 6 shows a vertical power transistor divided into single pieces including a divided edge structure.

FIG. 6 illustrates further possibilities or embodiments for the use or the creation of different types of layout part pieces, which may be used as initial objects during the design process in order to establish the desired transistor structure in the form of a layout. For example, the edge structure may also be divided into single pieces. In this case the partitioned transistor consists of an end piece 11 possibly including a gate terminal 3, a central piece 12 comprising a defined number of single transistor cells 2, a part piece of the edge structure 13 forming the corners based on a rotated or mirrored configuration, and an edge piece 14.

Figure 7:
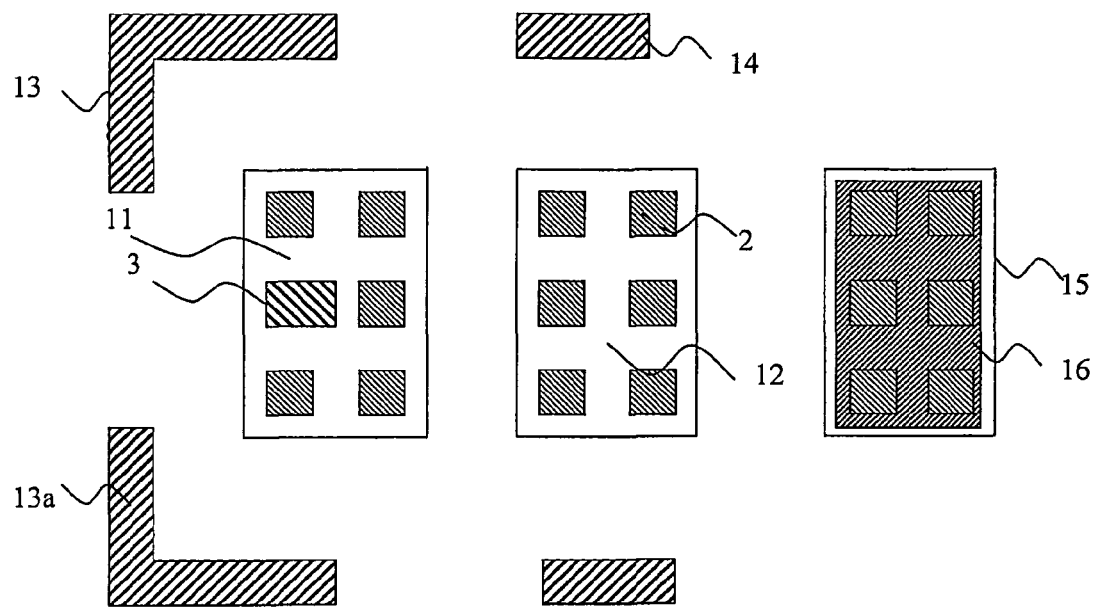
FIG. 7 shows a vertical power transistor divided into single pieces including a piece that includes a bond pad opening.

FIG. 7 depicts a piece of a partitioned transistor 15, that is, of its layout that includes a further structure. In the present example a bond pad opening 16 is provided as may be used in discrete power transistors. In other embodiments any other structures may be used, such as drain or source terminals of integrated power transistors.

The part pieces shown in the figures thus represent efficient design tools that may be created and/or compiled in a computer aided platform (not shown) according to the principles discussed above in order to generate a plurality of differing transistor designs.

One advantageous embodiment comprises a method for the construction of vertical metal oxide semiconductor (MOS) power transistors that are adapted to different power levels. The method comprises that these transistors are composed to a complete device design as a combination of differing standardized part pieces, each of which corresponds to a specified function and has a corresponding layout based on a dividing grid and also has known data. Thus, a part piece, such as the part piece 7, includes a defined number of identical single transistor cells 2 in the same geometrical arrangement together with a certain edge portion 9, another part piece, such as the part piece 5, includes a certain number of identical transistor cells 2 together with the gate terminal 3 and another section of the edge portion, and a further part piece, such as the part piece 6, includes a certain number of identical transistor cells 2 together with a further section of the edge portion, and these part pieces are combined to form device units of differing total area, wherein the power grading results from the size of the part piece forming the centre of the device area.

One advantageous embodiment comprises a method for the construction of vertical MOS power transistors that are adapted to different power levels, wherein the method comprises that these transistors are composed to a complete device design as a combination of differing standardized part pieces, each of which corresponds to a specified function and has a corresponding layout based on a dividing grid and also has known data. Thus, a first part piece, such as the part piece 12, includes a defined number of identical single transistor cells 2 in the same geometrical arrangement, a second part piece, such as the part piece 11, includes a certain number of identical transistor cells 2 together with the gate terminal 3, and a third part piece, such as the part piece 15, includes open bond pads 16, and wherein further part pieces are provided that form certain sections of the edge portion, such as the portions 13, 13a, 14, and wherein the part pieces are combined to device units of differing total area, wherein the power grading results from the size of the part piece forming the centre of the device area, such as the part piece 12.

In a further embodiment the device does not comprise the third part piece, such as the part pieces 15.

In a further embodiment the third part piece may also comprise functional elements other than the bond pads 16.

We claim:

1. A method for designing a vertical metal oxide semiconductor (MOS) power transistor having a specified design power level, the method comprising:
   composing a layout of the vertical MOS power transistor as a combination of at least partly differing layout part pieces, the part pieces defining the structure of the vertical MOS power transistor, each part piece having known design data, wherein at least some of said part pieces are first layout part pieces, each said first layout part piece having the same configuration and having identical design data, and each said first layout part piece containing at least a plurality of single transistor cells; and
   adjusting said specified design power level by adjusting the number of the first layout part pieces used in the layout of the vertical MOS power transistor; and
   wherein part pieces having the same edge portion include a specified number of identical single transistor cells having the same geometrical arrangement.

2. The method of claim 1, wherein each of said part pieces is at least one of a standardized piece and has a corresponding layout fixed to a dividing grid.

3. The method of claim 1, wherein at least one type of part pieces is provided that does not comprise single transistor cells.

4. The method of claim 3, wherein said at least one type of part pieces having no single transistor cells comprises part pieces including edge portions.

5. The method of claim 1, wherein at least one part piece is provided that includes at least one of a bond pad layout, a drain terminal layout and a source terminal layout.

6. A method for designing a vertical metal oxide semiconductor (MOS) power transistor having a specified design power level, the method comprising:
   composing a layout of the vertical MOS power transistor as a combination of at least partly differing out part pieces, the part pieces defining the structure of the vertical MOS power transistor, each part piece having known design data, wherein at least some of said part pieces are first layout part pieces, each said first layout part piece having the same configuration and having identical design data, and each said first layout part piece containing at least a plurality of single transistor cells;
   adjusting said specified design power level by adjusting the number of the first layout part pieces used in the layout of the vertical MOS power transistor;
   wherein:
      at least one of: each of the part pieces includes a certain section of the complete edge portion and a second part piece is used that has at least a gate terminal;
      at least some of the part pieces comprise edge portions that can be composed so as to form a complete edge portion of the layout of the vertical MOS power transistor;
      a third part piece is provided that differs from said first and second part pieces in at least one design characteristic; and
      said first, second and third part pieces include a section of the edge portion, which in combination form the complete edge portion; and
   designing at least a second vertical MOS power transistor having a second, different specified power level by combining at least said first, second and third part pieces into device units of differing total area, wherein a power grading between the vertical MOS power transistor and the second vertical MOS power transistor results from a size of the part piece forming the center of the device.

7. The method of claim 6, wherein said second part piece includes at least one of a specified number of identical single transistor cells and a section of the complete edge portion.

8. A method for designing a vertical metal oxide semiconductor (MOS) power transistor having a specified design power level, the method comprising:
composing a layout of the vertical MOS power transistor as a combination of at least partly differing layout part pieces, the part pieces defining the structure of the vertical MOS power transistor, each part piece having known design data, wherein at least some of said part pieces are first layout part pieces, each said first layout part piece having the same configuration and having identical design data, and each said first layout part piece containing at least a plurality of single transistor cells; and
adjusting said specified design power level by adjusting the number of the first layout part pieces used in the layout of the vertical MOS power transistor;
wherein at least one part piece is provided that does not include an edge portion.

9. A method for designing a vertical metal oxide semiconductor (MOS) power transistor having a specified design power level, the method comprising:
composing a layout of the vertical MOS power transistor as a combination of at least partly differing layout part pieces, the part pieces defining the structure of the vertical MOS power transistor, each part piece having known design data, wherein at least some of said part pieces are first layout part pieces, each said first layout part piece having the same configuration and having identical design data, and each said first layout part piece containing at least a plurality of single transistor cells;
adjusting said specified design power level by adjusting the number of the first layout part pieces used in the layout of the vertical MOS power transistor; and
generating at least some differing layout part pieces by dividing a complete layout of a vertical MOS power transistor having known design data, wherein said dividing comprises:
generating a plurality of differing types of part pieces, wherein part pieces of the same type have the same configuration and identical design data; and
calculating the design data of each type of part pieces from the known design data of the complete layout so as to obtain standardized part pieces for a layout fixed to a dividing grid.

10. A method for generating standardized layout part pieces for designing vertical metal oxide semiconductor (MOS) power transistors designed for different power levels, the method comprising:
generating at least some differing layout part pieces by dividing a complete layout including a plurality of single transistor cells of a vertical MOS power transistor having known design data, the part pieces defining the structure of the vertical MOS power transistor;
generating a plurality of different types of part pieces, wherein at least some of the part pieces comprise part pieces of a specific type, each part piece of the specific type having the same configuration and identical design data; and
calculating the design data of each type of part piece from the known design data of the complete layout so as to obtain standardized part pieces for a layout fixed to a dividing grid.

11. The method of claim 10, wherein said single transistor cells have the same configuration.

12. The method of claim 10, wherein at least some of the part pieces include edge portions that can be combined in a sectional manner so as to form a complete edge portion of the layout of the vertical MOS power transistor.

13. The method of claim 12, wherein part pieces having the same edge portion include a specified number of identical single transistor cells having the same geometrical arrangement.

14. The method of claim 10, wherein a type of part piece is generated that has at least one of: a gate terminal, a bond pad layout, a drain terminal layout and a source terminal layout.

15. The method of claim 10, wherein at least one type of part piece is generated that does not include single transistor cells and at least one type of part piece is generated that does not include transistor cells but comprises edge portions.

16. The method of claim 10, wherein at least one type of part pieces is generated that does not include edge portions.

* * * * *

UNITED STATES PATENT AND TRADEMARK OFFICE
CERTIFICATE OF CORRECTION

PATENT NO.         : 8,190,415 B2
APPLICATION NO.    : 11/576736
DATED              : May 29, 2012
INVENTOR(S)        : Ralf Lerner and Wolfgang Miesch It is certified that error appears in the above-identified patent and that said Letters Patent is hereby corrected as shown below:

Col. 6, Line 38, "partly differing out" should read --partly differing layout--

Signed and Sealed this
Fourth Day of September, 2012

David J. Kappos
*Director of the United States Patent and Trademark Office*